United States Patent
Chuang et al.

(10) Patent No.: US 8,232,643 B2
(45) Date of Patent: Jul. 31, 2012

(54) LEAD FREE SOLDER INTERCONNECTIONS FOR INTEGRATED CIRCUITS

(75) Inventors: Yao-Chun Chuang, Taipei (TW); Ching-Wen Hsiao, Banqiano (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 12/729,021

(22) Filed: Mar. 22, 2010

(65) Prior Publication Data

US 2011/0193227 A1 Aug. 11, 2011

Related U.S. Application Data (60) Provisional application No. 61/303,522, filed on Feb. 11, 2010.

(51) Int. Cl.
*H01L 23/488* (2006.01)
*H01L 21/60* (2006.01)
*H01L 23/31* (2006.01)

(52) U.S. Cl. ......... 257/738; 257/E23.023; 257/E23.129; 257/E21.503; 257/E21.509; 257/737; 257/778; 257/734; 257/779; 257/780; 257/765; 257/764; 257/763; 257/762; 257/767; 257/766

(58) Field of Classification Search .......... 257/738, 257/778, E21.503, E21.509, E23.023, E23.129, 257/734, 779, 780, 765, 764, 763, 762, 767, 257/766

See application file for complete search history.

(56) References Cited

U.S. PATENT DOCUMENTS

| 6,277,669 | B1 | 8/2001 | Kung et al. | |
|---|---|---|---|---|
| 2005/0104222 | A1 | 5/2005 | Jeong et al. | |
| 2006/0275952 | A1* | 12/2006 | Gowda et al. | 438/122 |
| 2007/0114662 | A1* | 5/2007 | Helneder et al. | 257/737 |
| 2009/0090543 | A1* | 4/2009 | Furuyama et al. | 174/257 |
| 2010/0015796 | A1* | 1/2010 | Tago et al. | 438/614 |
| 2011/0068465 | A1* | 3/2011 | Shen et al. | 257/737 |
| 2011/0155433 | A1* | 6/2011 | Funaya et al. | 174/258 |
| 2011/0169170 | A1* | 7/2011 | Baba et al. | 257/774 |
| 2011/0186989 | A1* | 8/2011 | Hsiao et al. | 257/737 |
| 2011/0193219 | A1* | 8/2011 | Lai et al. | 257/737 |
| 2011/0210441 | A1* | 9/2011 | Lee et al. | 257/737 |
| 2011/0285013 | A1* | 11/2011 | Chuang et al. | 257/737 |
| 2011/0291262 | A1* | 12/2011 | Shen et al. | 257/737 |

OTHER PUBLICATIONS

Ho, C.E., et al., "Interfacial reaction issues for lead-free electronic solders," J Mater Sci: Mater Electron (207) vol. 18, pp. 155-174.
Tseng, H.W., et al., "Evolution of Ag3Sn compound formation in Ni/Sn5Ag/Cu solder joint", Materials Letters, vol. 62 (2008), pp. 3887-3889.

* cited by examiner

*Primary Examiner* — A O Williams
(74) *Attorney, Agent, or Firm* — Slater & Matsil, L.L.P.

(57) ABSTRACT

Lead free solder interconnections for integrated circuits. A copper column extends from an input/output terminal of an integrated circuit. A cap layer of material is formed on the input/output terminal of the integrated circuit. A lead free solder connector is formed on the cap layer. A substrate having a metal finish solder pad is aligned with the solder connector. An intermetallic compound is formed at the interface between the cap layer and the lead free solder connector. A solder connection is formed between the input/output terminal of the integrated circuit and the metal finish pad that is less than 0.5 weight percent copper, and the intermetallic compound is substantially free of copper.

20 Claims, 7 Drawing Sheets

LEAD FREE SOLDER INTERCONNECTIONS FOR INTEGRATED CIRCUITS

This application claims the benefit of U.S. Provisional Application No. 61/303,522 filed Feb. 11, 2010 and entitled "Methods and Apparatus for Robust Flip Chip Interconnections", which is hereby incorporated in its entirety herein.

TECHNICAL FIELD

The present invention relates to an integrated circuit designed to be connected to a circuit board using lead free solder bumps, lead free solder balls or lead free solder columns to form the connections between the integrated circuit and other circuitry, such as a flip chip packaged integrated circuit. Methods for making reliable connections using lead free solder material are provided, and the integrated circuit packages and methods incorporating the features of the invention are compatible with existing state of the art and planned semiconductor processes.

BACKGROUND

A current common requirement for an advanced electronic circuit and particularly for circuits manufactured as integrated circuits ("ICs") in semiconductor processes is the use of a solder bump, solder ball or solder column connections. In a "flip chip" approach to packaging and interconnections, the solder bumps are used to couple the external terminals of a monolithic integrated circuit (which may be a silicon substrate with active or passive circuit elements and connections formed upon it, or other substrate materials including gallium arsenide (GaAs) and silicon on insulator (SOI), and silicon germanium (SiGe) may be used) to a package substrate or circuit board. These integrated circuit devices may have tens or hundreds of input and output terminals for receiving, and sending, signals and/or for coupling to power supply connections. In some IC designs the terminals are placed at the periphery of the integrated circuit and away from the active circuitry. In more advanced and complex integrated circuits, the terminals may be placed over the active area and lie over the active devices. In memory ICs, sometimes a center pad arrangement is used.

In a "flip chip" application, the integrated circuit (IC) is sometimes mounted face down (flipped). Terminal openings are formed in a protective insulating layer, called a passivation layer that overlies the face of the device. The input/output terminals are exposed and solder bumps, solder columns or solder balls are placed on these terminals, usually referred to as pads or lands, which may be formed as columns of conductive material extending away from the surface of the integrated circuit. The solder balls are then used to form the external connections to the integrated circuit. These solder balls may be provided already formed on the completed integrated circuit, using a "wafer scale" approach, or, may be added later after the devices are singulated into individual devices called "dice", or even disposed on a substrate or circuit board, and the integrated circuit then aligned with these balls and carefully placed on it. In any case, a thermal solder reflow process is typically used to complete the solder connection between the flip chip integrated circuit, and a substrate, film, printed circuit board or even another silicon device. In thermal reflow the solder bumps, balls, or columns form a permanent mechanical and electrically conductive connection between the terminals of the integrated circuit and the substrate. The combined flip chip IC and substrate may then be packaged as a single integrated circuit. Alternatively, in a multiple chip module form, the flip chip may be combined with other integrated circuits which may also be "flip chips" or wire bond connections may be used. For example sometimes memory devices such as FLASH nonvolatile devices, and processors that would use the FLASH device for program or data storage, are combined in a single packaged device. IC devices may be stacked vertically, or placed alongside one another using a larger substrate or circuit board.

Recently the semiconductor industry has been moving to "lead (Pb) free" packaging and device connector technology. This trend increasingly results in the use of lead free solder bumps and lead free solder balls to form connections with integrated circuits and packages. These lead free solder materials are formed of tin and tin alloys which may include, for example, silver, nickel, copper and other metals. The use of lead free solder balls is safer for the environment, safer for workers in the industry and safer for consumers than lead based solder bumps or solder balls. However, the quality and reliability of the final solder connections formed has not always been as great as desired. During thermal cycle (TC) testing, for example, cracks in the completed solder connections have been observed. A typical thermal cycle test will perform 500 thermal cycles (TC 500) ranging from the minimum specified temperature (typically −55 degrees Celsius) to the maximum specified temperature (typically +125 degrees Celsius), and then the solder connections may be inspected. Often following TC500 testing using conventional solder lead free solder connections, ball cracks are found. Ball cracks are an indicator that during actual use in an application, a solder connection is going to fail by pulling apart. Clearly this is unacceptable in a useful product.

Further, recent advances in interconnection technology for integrated circuit have caused a transition from aluminum or aluminum alloy conductors used within the integrated circuit and extending to the terminals, to copper based interconnect technologies. Often copper conductors are formed over the substrate using a damascene or dual damascene approach. In this technology, a trench or trench and via combination is formed in an insulation dielectric material that forms interlayer dielectric (ILD) or inter-metal dielectric (IMD), a seed layer of copper or copper alloy is formed within the trench, electroplating or electroless chemical deposition (ECD) is used to fill the trench and/or via opening with the copper based interconnect material, and sometimes a chemical mechanical process (CMP) tool is used to mechanically and chemically abrade any excess copper material above the surface of the trench to form a planar surface at the top of the trench or via. In this way the pattern of the trench in the dielectric finally determines the pattern of the conductors. Many levels of interconnect may be formed above the transistors and active devices, which are typically formed at the surface of the underlying semiconductor substrate. The interconnect material of copper or copper alloy may extend to the terminal pads or ball lands or columns of the integrated circuit, and in such a conventional case copper or an alloy of copper is the material that the solder bumps or balls would be then be deposited upon.

TC500 tests and analysis of lead free solder balls or bumps formed on copper pads indicate that the use of copper as a metallization material at the solder ball terminals of the integrated circuit and/or on the trace of the corresponding circuit board that receives the flip chip integrated circuit may cause the balls to exhibit ball cracks. During solder reflow, which is a thermal process, an intermetallic compound (IMC) is formed within the solder ball between the integrated circuit terminal, which is a copper pad or column, and the solder materials. However if the ball does not adhere well at the interface between the solder and the IMC, then ball cracks are likely to occur.

Accordingly, methods and apparatus for packaging integrated circuits and for forming low resistance electrical connections to circuit boards that form robust and high quality electrical and mechanical connections, while using lead free solder materials, are needed.

SUMMARY

These and other problems are generally solved or circumvented, and technical advantages are generally achieved by embodiments of the present invention, which provides an integrated circuit package with terminals that are pads or columns to receive solder connections, these are formed of copper, with an added layer of protective metal comprising, for example, nickel and its alloys.

In an exemplary embodiment, an apparatus comprises an integrated circuit formed on a semiconductor substrate. The integrated circuit has at least one input/output terminal comprising copper formed in an upper portion of the integrated circuit, and a metal cap layer overlying an upper surface of the at least one input/output terminal. A substrate comprising at least one conductive trace formed on a first surface is provided with a metal finish layer overlying a portion of the at least one conductive trace and forming a solder pad. A lead free solder connection is disposed between the metal cap layer and the solder pad, wherein the copper content of the lead free solder connection is less than 0.5 wt. % (weight percent).

In another exemplary embodiment, an apparatus comprises a circuit board having a plurality of solder balls disposed on a bottom surface of the circuit board. A plurality of conductive traces is disposed on a top surface of the circuit board, and electrically coupled to a respective one or more of the solder balls. A plurality of terminals on the top surface of the circuit board is coupled to respective ones of the conductive traces and have a metal finish comprising nickel. A flip chip integrated circuit, having input/output terminals comprising copper is oriented face down, having a bottom surface facing the top surface of the circuit board. A metal cap layer comprising nickel is formed on the bottom surface of each of the input/output terminals; and a plurality of lead free solder connectors form connections between the metal cap layers and the metal finish of the terminals.

In another exemplary embodiment, a method is provided comprising providing an integrated circuit with input/output terminals for external connectors formed on one surface. A plurality of copper columns is provided extending from the input/output terminals, each copper column having a bottom surface; and a cap layer is provided comprising nickel overlying the bottom surface of each of the copper columns. A lead free solder connector is provided over each of the cap layers. The method continues by orienting the integrated circuit, the copper columns with the cap layers and the lead free solder connectors facing a top surface of a substrate, the substrate having a nickel based metal finish covering a plurality of solder ball pads in alignment with respective ones of the lead free solder connectors; and placing the lead free solder connectors in proximity to the corresponding solder ball pads. A thermal reflow process is performed to solder the solder ball pads on the substrate to the input/output terminals of the integrated circuit, the lead free solder connectors bonding to the solder ball pads and the cap layers.

This summary gives an overview of certain embodiments of the invention, and is not limiting. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
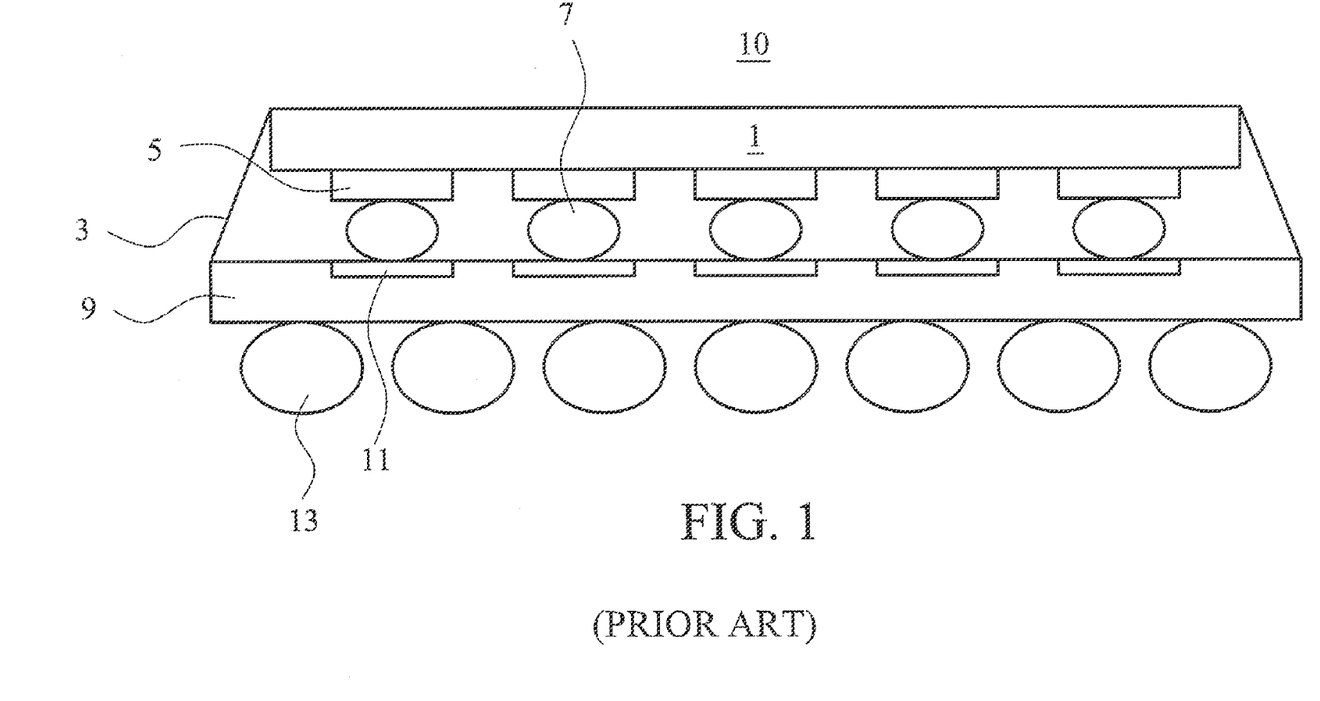
FIG. 1 illustrates a conventional flip chip ball grid array package for an integrated circuit.

FIG. 1 depicts a conventional ball grid array (BGA) integrated circuit package 10 formed using a flip chip arrangement. In FIG. 1, an IC 1 which may be a memory, processor, analog or digital circuit, ASIC, mixed signal circuit or other device, is provided. The IC 1 has columns 5 for forming ball pads or lands to form IC input/output terminals. The flip chip IC 1 is mounted face down and facing the top surface a substrate 9. Substrate 9 may be a printed circuit board, a silicon substrate, a ceramic substrate, a plastic substrate, a film, a foil or other circuit carrying medium. External solder balls 13 are used to mount the completed device to a system level circuit board. Alternatives to the ball grid array package and the use of solder balls 13 are pin grid arrays, leaded and leadless ceramic carriers, plastic carriers, and other IC packages and modules known to those skilled in the art.

In FIG. 1, lead free solder balls 7 are shown. These may comprise tin (Sn), silver (Ag), and copper for example, to form so-called "SAC" type solder connectors. Other tin alloys may be used. An important feature of these solder balls is the absence of the traditional lead (Pb) material. In FIG. 1, an optional underfill 3 such as an epoxy, resin, plastic molding compound, or other material is shown. This underfill may not be used in all cases, but when used, it provides strength and thermal stress compensation, as the package normally experiences thermal stress after the package 10 is formed. In forming the package 10 of FIG. 1, the solder balls 7 are aligned with the metal finish pads 11 on substrate 9; and then a thermal solder reflow is performed, allowing the solder balls 7 to reflow and bond to the copper columns 5 and connect them with the metal finish pads 11 on the circuit board 9; thus completing the mechanical and electrical connection between the integrated circuit 1 and the package substrate 9. Although not visible in FIG. 1, the substrate 9 often is a multi layer circuit board that includes a redistribution layer. Such a redistribution layer may remap the connections from the integrated circuit columns 5 to the solder balls 13. Further, an under bump metallization (UBM) layer may be used between the copper columns 5 and the IC terminals.

Figure 2:
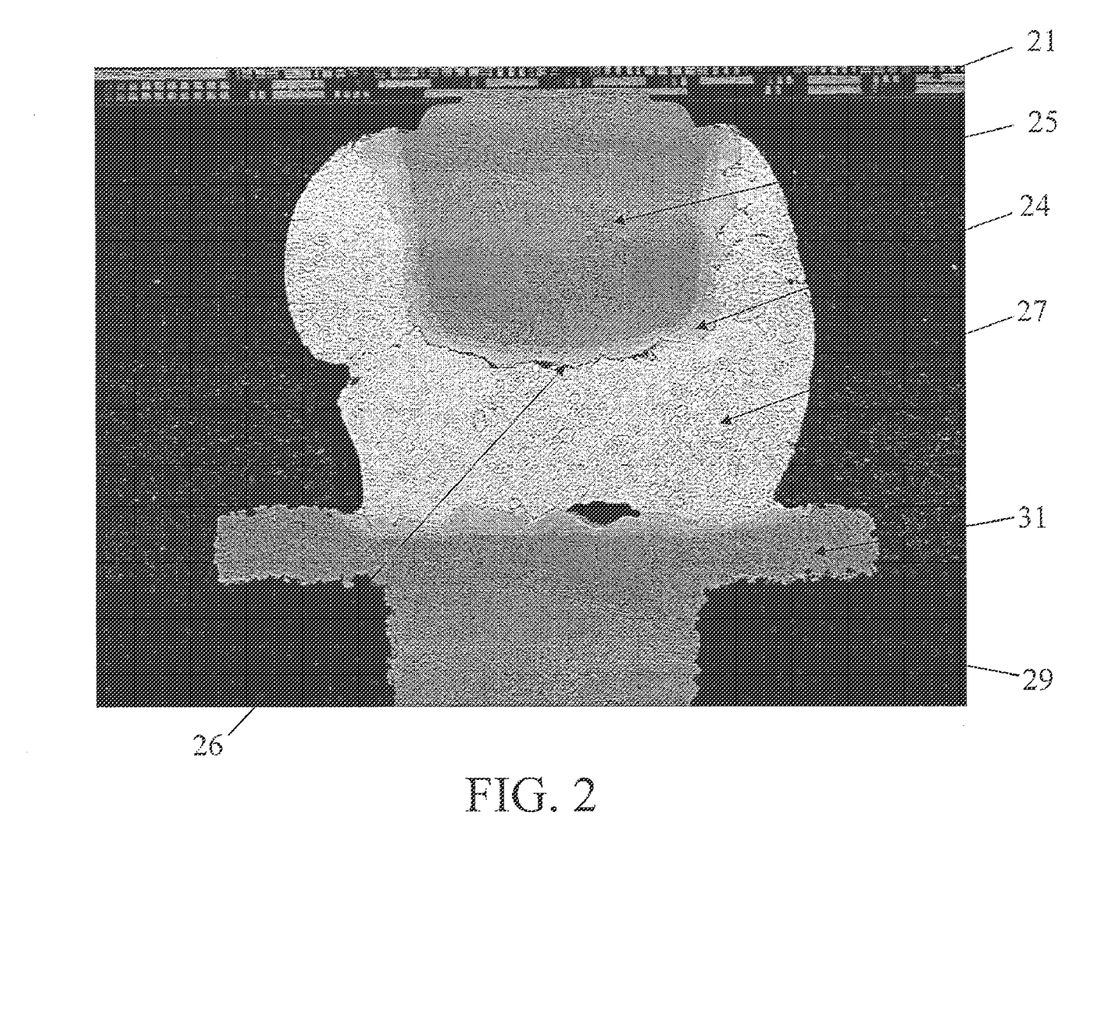
FIG. 2 illustrates a first example of a sample lead free solder connection subjected to a thermal cycle test shown in a cross section view enlarged by an electron micrograph and showing ball cracks.

FIG. 2 depicts in an electron micrograph the results of a first 500 cycle thermal test on a sample of a solder ball connection 27. In this example, the lead free solder 27 was used with a copper column solder pad 25 on an integrated circuit 21. The solder was arranged to connect to a pad 31 on a substrate circuit board. The electron micrograph of FIG. 2 is greatly enlarged and shows the copper column 25 extending from integrated circuit 21, and a circuit board 29 with metal finish ball pad 31. In this sample, a copper or copper alloy column 25 is used as the IC terminal, and the metal finish 31 on the circuit board is also copper or a copper alloy. Lead free solder ball 27 is shown after the assembly and after the TC500 thermal cycle tests. Areas of interest are the intermetallic compound (IMC) 24 and the adjacent solder-IMC interface. Ball cracks 26 are clearly visible in this sample after the thermal cycle test of 500 cycles. The intermetallic compound 24 has been identified as $Cu_6Sn_5$.

Figure 3:
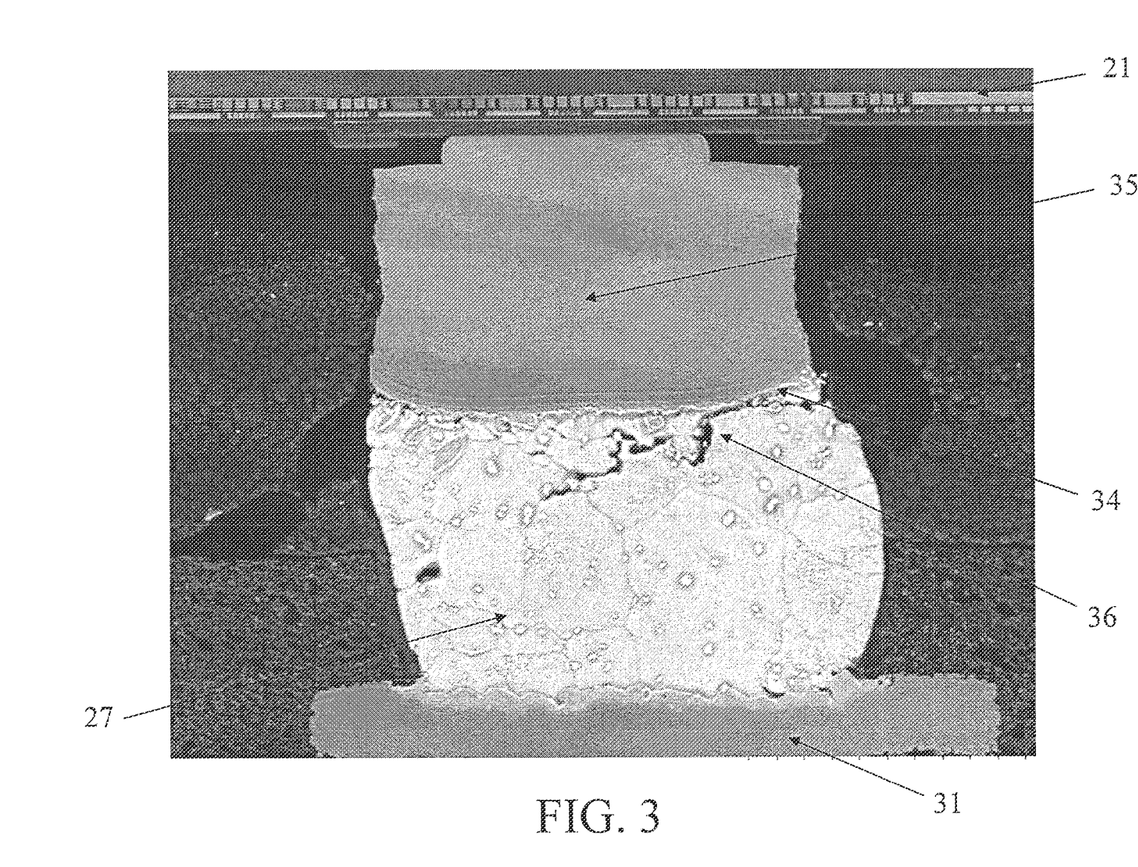
FIG. 3 illustrates a second example of a sample lead free solder connection subjected to a thermal cycle test shown in a cross section view enlarged by an electron micrograph and showing ball cracks.

FIG. 3 depicts a second 500 cycle thermal test sample of a lead free solder ball 27. In the sample of FIG. 3, the lead free solder is shown used with a nickel or nickel alloy column solder pad 35 on an integrated circuit 21 to connect to a copper pad 31 on a circuit board. The electron micrograph of FIG. 3 is again greatly enlarged and shows the nickel column 35 extending from integrated circuit 21, and again a circuit board with a metal finish ball pad 31. In this sample, a nickel column ball pad 35 is used as the IC terminal, and the metal pad finish on the circuit board 29 is copper or a copper alloy. Areas of interest are the intermetallic compound (IMC) 34 and the adjacent solder-IMC interface. Ball cracks 36 are also clearly visible in this sample after the thermal cycle test of 500 cycles. The intermetallic compound 34 has been identified as $(Cu,Ni)_6Sn_5$.

Figure 4:
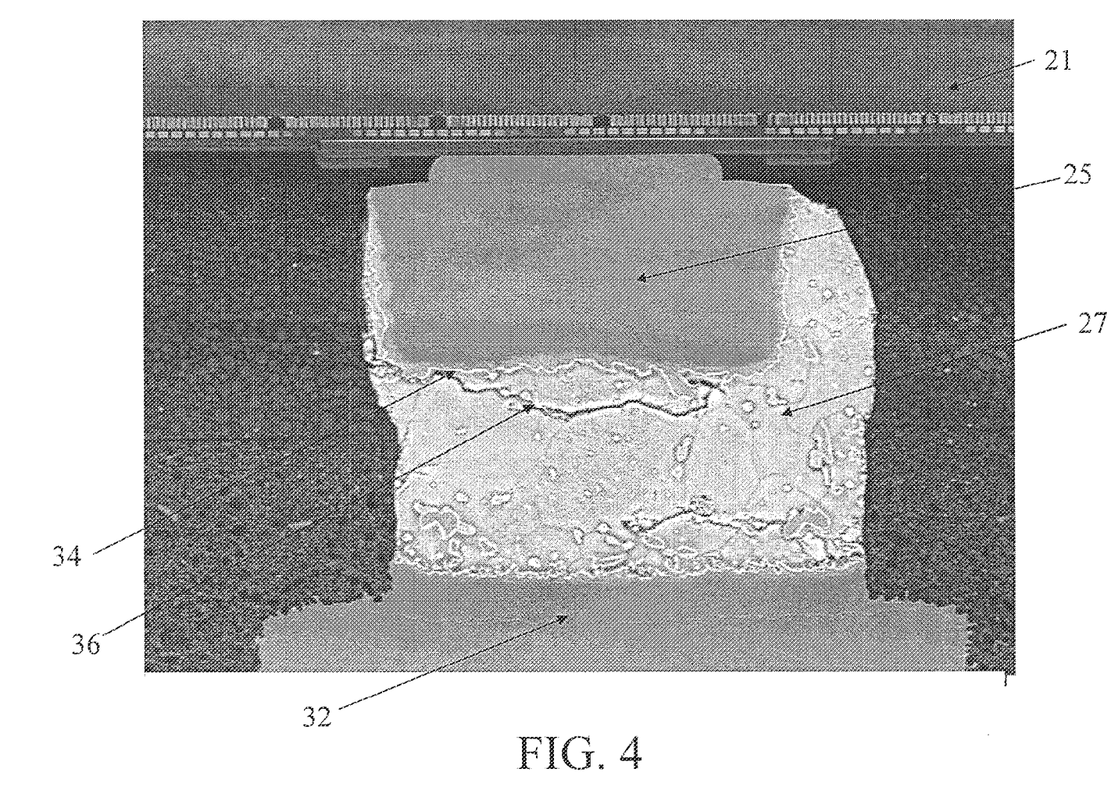
FIG. 4 illustrates a third example of a sample lead free solder connection subjected to a thermal cycle test and shown in a cross section view enlarged by an electron micrograph and showing ball cracks.

FIG. 4 depicts a third 500 cycle thermal test sample of a lead free solder ball 27 used with a copper or copper alloy solder pad 25 on an integrated circuit 21 to connect to a nickel metal pad 32 on a circuit board. The electron micrograph of FIG. 4 is again greatly enlarged and shows the copper column ball land 25 extending from integrated circuit 21, and again a circuit board 29 but now with a nickel metal finish pad 32. Lead free solder ball 27 is shown and areas of interest are the intermetallic compound (IMC) 34 and the adjacent solder-IMC interface. Ball cracks 36 are again clearly visible in this sample after the thermal cycle test of 500 cycles. The intermetallic compound 34 had been identified as $(Cu,Ni)_6Sn_5$.

So for each test sample in FIGS. 2, 3 and 4 where copper or copper alloy directly connects with lead free solder, following thermal cycling tests, ball cracks are observed. Further the ball cracks are always near the thick interface between the IMC, and the solder, which is CuSn/solder or (Cu,Ni) Sn/solder.

In a paper entitled "Evolution of $Ag_3Sn$ compound formation in $Ni/Sn_5Ag/Cu$ solder joint" in Materials Letters, Vol. 62, pages 3887-3889, 2008, by H. W. Tseng and C. Y. Liu, which is hereby incorporated herein in its entirety, solder samples were analyzed and it appears that a precipitate of $Ag_3Sn$ forms when nickel and copper materials are used on opposite ends of a lead free solder connection, comprising for example a tin solder with silver, $Sn_5Ag$. The paper also indicates that the $Ag_3Sn$ precipitate has a preference for areas within the solder/IMC formation as follows: $(Cu,Ni)_6Sn_5 > Cu_6Sn_5 > solder > Ni_3Sn_4$. In the paper a sample solder between nickel and copper terminals was analyzed over time at 250 degrees C., and the $Ag_3Sn$ precipitate was found to concentrate at the area where $(Cu,Ni)_6Sn_5$ was located. This analysis also shows the mobility of copper atoms in the solder, as it moved through the solder material towards the nickel over time.

Silver (Ag) is a necessary component in the tin based lead free solder; it is added to the lead free solder to achieve certain desired mechanical properties. It has been determined by the inventors that the use of SnAg solder combined with copper pads can result in $Ag_3Sn$ precipitate forming at the interface between the intermetallic compound (IMC) and the remaining Sn solder. It appears from analysis of ball crack TC500 samples that the $Ag_3Sn$ precipitate has poor adhesion and mechanical properties and thus the presence of this material at the IMC/solder interface can increase solder ball cracks. Also, copper is very mobile and exhibits diffusion in many materials, including the lead free solder ball material, and copper intermetallic compounds form rapidly when copper is used as the solder ball column or pad. Ball cracks appear to be more likely to occur when a thick Cu—Sn material forms at the solder/IMC interface between the solder connector and a copper pad, column or trace.

An analysis of samples with, and without, the $Ag_3Sn$ precipitate at the interface region showed no ball cracks when there were no, or fewer $Ag_3Sn$ molecules, at the IMC/solder interface, and other samples showed increasing ball cracks at the IMC/solder interface when more $Ag_3Sn$ molecules were present.

Embodiments of the present invention which are now described in detail provide novel methods and apparatus to improve the strength of solder connections made using lead free solder, and to reduce or eliminate the ball cracks observed in the conventional lead free solder flip chip arrangements used previously.

Figure 5:
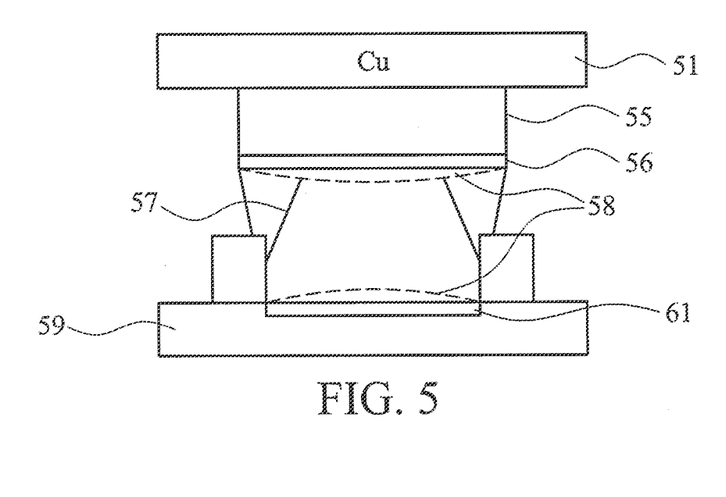
FIG. 5 illustrates in a cross section a first exemplary embodiment of the invention.

FIG. 5 depicts in one exemplary embodiment a cross sectional view of a single lead free solder connection. In FIG. 5, an integrated circuit 51 is depicted with a copper or copper alloy column or post 55 extending from the integrated circuit as an input/output terminal. In a practical application there would be many of these copper posts, tens, hundreds or even thousands of connections are needed for advanced integrated circuits. This copper post is, in an exemplary embodiment of an integrated circuit, formed at a 45 nanometer semiconductor process node, about 40 microns tall. However, the height of the column 55 will vary with device size, process technology, and manufacturer and the height or thickness of these columns is not restricted. A metal cap layer 56 is provided on at least the bottom exterior surface of the copper post 55. Note that in this embodiment, no metal cap is needed on the copper post sidewalls, which simplifies processing. The cap layer 56 may be formed by electroplating, or by electroless processes for depositing metal layers, as is known in the art. Layer 56 may be formed by several known approaches, including electroplating, electroless processes, any chemical depositing method, such as CVD (chemical vapor deposition) processes, or PVD processes. In different alternative embodiments, materials including Ni, Ni (alloy), Ni (Co), Ni (V), Ni (P), Ni (Bi), Pd, Pt, Au, Ag, Co, were used for layer 56. Each of these is contemplated as an additional embodiment, and layers may be combined to form additional contemplated embodiments.

In one exemplary embodiment a nickel cap layer is used. The nickel cap layer may be as thin as 1 um thick in one example, although this thickness will vary and will scale with semiconductor processes. It may be substantially thicker if desired, as well, so long as the cap layer isolates the copper post material from the lead free solder. As the integrated circuit devices shrink in size, the copper columns will shrink, the solder bumps will also become somewhat smaller and the thickness of the cap layer may also vary. Importantly, the cap layer 56 prevents copper atoms from contacting the lead free solder balls. The cap layer should be thick enough to prevent or reduce the number of copper ions diffusing into the lead free solder balls during processing, and during subsequent thermal cycles. The intermetallic compound (IMC) formed in this embodiment at areas 58 is $Ni_3Sn_4$.

A lead free solder connector 57 is formed between the integrated circuit 51 and the circuit board or substrate 59. A lead free solder ball of between 10 microns and 400 microns is used. This may comprise for example tin (Sn) and silver (Ag) as described above. A solder ball pad 61 is shown on the circuit board with a metal finish. In an exemplary embodiment the metal finish is also a nickel finish. Other alternatives include nickel based finishes, such as nickel alloys. Nickel/gold may be used, electroless nickel and alloy gold (ENAG), electroless nickel electroless palladium and immersion gold (ENEPIG), electroless nickel and immersion gold (ENIG), and other metal finish layers comprising nickel may be used. The metal finish thickness may vary but may be between 0.3~8 um. If copper or copper containing traces, which are sometimes used, are used in the substrate or circuit board, the metal finish is an additional layer over the surface ensuring the copper from the circuit trace on the circuit board does not contact the lead free solder ball either before, during or after the thermal reflow occurs. The thickness of the metal finish may be quite thin and this thickness may be varied, so long as copper from the substrate traces does not contact the solder material either initially as the IC is mounted on the substrate or after thermal reflow and thermal cycling. Thicknesses may be from 0.8-8 microns, for example, in current processes. The important feature is that copper not contact the lead free solder, and that copper not diffuse into the solder connector during thermal cycling.

The intermetallic compound 58 formed in this exemplary embodiment will be $Ni_3Sn_4$. The copper will not be in contact with the lead free solder and will not diffuse into the solder to form the unwanted $Cu_6Sn_5$ or $(CuNi)_6Sn_5$ intermetallic compounds, as in the conventional approaches.

It has been surprisingly discovered that when copper is greatly reduced or eliminated from the lead free solder connectors during and after reflow, ball cracks do not occur as in the conventional arrangements. Preferably both the integrated circuit column cap layers, and the metal finish of the substrate, are formed of nickel or nickel alloys so that the solder connectors are disposed in a nickel/solder/nickel arrangement. Further the amount of copper in the lead free solder bumps should be reduced or eliminated. The copper weight of the solder connectors after reflow should be less than 0.5 wt % (weight percent) If that concentration of copper is maintained, the IMC formed in the solder balls at the column/solder ball interface will be $Ni_3Sn_4$; which as discussed above, has a lower preference for the $Ag_3Sn$ precipitate than the solder itself, so that the $Ag_3Sn$ precipitate will not be concentrated at the interface between the intermetallic compound and the solder. Thus, the adhesion and reliability problems of the lead free solder balls of the conventional approaches do not occur. Surprisingly, ball cracks do not form or are greatly reduced when the exemplary embodiments are used with lead free solder materials.

Ni-based cap and Ni-based metal finish are used in the exemplary embodiment described above. However, there are other alternatives that may also be used to keep copper from diffusing from the metal cap and from the substrate traces into the lead free solder connectors. Alternatives that are contemplated as additional embodiments include cap and metal finish materials such as Pd, Pt, Au, Ag, Co, and their alloys. The use of these cap and metal finish materials will also reduce or eliminate the ball crack problems over the conventional approaches, because the IMC formed will not be Cu—Sn at the IMC-solder interface. The resulting lead free solder connectors exhibit no, or greatly reduced, ball cracks following thermal testing.

Figure 6:
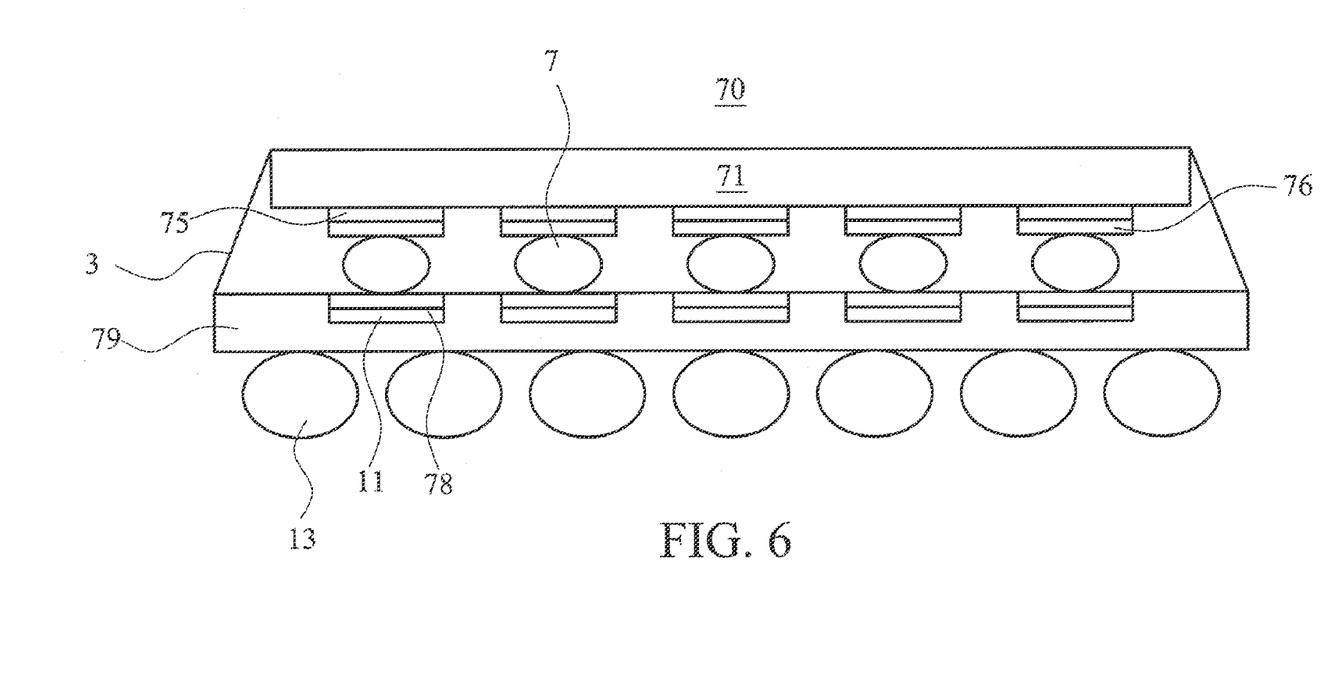
FIG. 6 illustrates in a cross section a second exemplary embodiment of the invention.

FIG. 6 depicts a flip chip package arrangement 70 incorporating the cap layer and metal finish of the exemplary embodiments. In FIG. 6, integrated circuit 71 is arranged in a flip chip, face down orientation with respect to the upper surface of substrate 79. Solder balls 13 provide connectors to the finished package. An underfill 3 may be used. Copper or copper alloy columns 75 extend from and provide input/output connections to the integrated circuit 71. A cap layer 76 of nickel or nickel alloy is formed as described above over the bottom surface of copper columns 75. Lead free solder connectors 7, which may be bumps, or balls, or columns of solder, are disposed over the nickel cap layers 76. A nickel based metal finish 78 is provided over solder ball pad terminals on the traces 11 in the substrate 79 and the solder connectors 7 form electrical and mechanical connection between the IC 71 and the substrate 79. Because the solder connectors 7 are each positioned between two nickel surfaces, the copper in the solder connectors is eliminated or reduced and after reflow, is below 0.5 wt. %. Ball cracks are reduced or eliminated.

Figure 7:
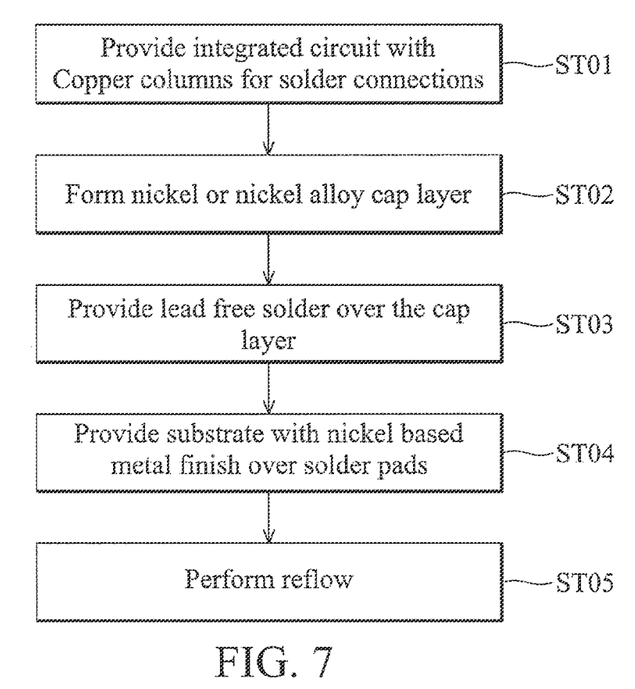
FIG. 7 illustrates in a flow diagram method steps of a method embodiment of the invention.

FIG. 7 depicts in a flow diagram a method for connecting an integrated circuit to a substrate or circuit board. The method begins at step ST01, where an integrated circuit is provided with copper columns for solder connections. At step ST02, a nickel or nickel alloy or other cap layer is formed on the exterior surface of the columns. Note that no nickel cap is required on the exposed sidewalls of the copper columns. At step ST03, lead free solder connections such as solder bumps, solder balls or solder columns, are disposed over the cap layer of the columns. At step ST04, a substrate is provided with nickel based metal finish or one of the alternative metal finishes disposed on pads for receiving the solder connections. This substrate is placed in alignment with the solder connectors. At step ST05, a reflow is performed to complete the mechanical and electrical connection.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
   an integrated circuit having:
   at least one input/output terminal comprising copper formed thereon;
   a metal cap layer overlying an upper surface of the at least one input/output terminal;
   a substrate comprising at least one conductive trace formed on a first surface;
   a metal finish layer overlying a portion of the at least one conductive trace and forming a solder pad;
   a lead free solder connection disposed between the metal cap layer and the solder pad; and
   a first intermetallic compound at an interface between the metal cap layer and the lead free solder connection;
   wherein the copper content of the lead free solder connection is less than 0.5 wt. % and the first intermetallic compound is substantially free of copper.

2. The apparatus of claim 1, wherein the metal cap layer is one selected from the group consisting essentially of nickel, palladium, silver, platinum, gold, cobalt, alloys and combinations thereof.

3. The apparatus of claim 1, wherein the lead free solder connection is a solder ball disposed on the metal cap layer of the integrated circuit.

4. The apparatus of claim 1, wherein the lead free solder connection is a solder bump formed on the metal cap layer of the integrated circuit.

5. The apparatus of claim 1, further comprising:
   an underfill material disposed between the integrated circuit and the substrate, the underfill surrounding the lead free solder connection.

6. The apparatus of claim 1, further comprising:
   solder balls disposed on a second surface of the substrate.

7. The apparatus of claim 1, wherein the substrate comprises a circuit board.

8. The apparatus of claim 1, wherein the substrate comprises a thin film.

9. An apparatus comprising:
   a circuit board having a plurality of solder balls disposed on a bottom surface of the circuit board;
   a plurality of conductive traces disposed on a top surface of the circuit board;
   a plurality of terminals on the top surface of the circuit board, each coupled to a respective one of the conductive traces and having a metal finish comprising nickel;
   a flip chip integrated circuit, having input/output terminals comprising copper and each having a bottom surface facing the top surface of the circuit board;
   a metal cap layer comprising nickel formed on the bottom surface of each of the input/output terminals;
   a plurality of lead free solder connectors forming connections between the metal cap layer and the metal finish of the terminals; and
   a first intermetallic compound formed at the interfaces between the metal cap layer of each of the input/output terminals and the plurality of lead free solder connectors, wherein the first intermetallic compound is substantially free of copper.

10. The apparatus of claim 9, wherein the lead free solder connectors each comprise a copper content of less than 0.5 wt. %.

11. The apparatus of claim 9, wherein the metal finish further comprises gold.

12. The apparatus of claim 9, wherein the metal finish further comprises immersion gold.

13. The apparatus of claim 9, wherein the metal finish further comprises electroless palladium and immersion gold.

14. The apparatus of claim 1, wherein the at least one conductive trace comprises copper.

15. The apparatus of claim 14, wherein the metal finish layer is one selected from the group consisting essentially of nickel, palladium, silver, platinum, gold, cobalt, alloys and combinations thereof.

16. The apparatus of claim 14, wherein the metal finish layer comprises nickel.

17. The apparatus of claim 14, and further comprising:
   a second intermetallic compound formed at the interface between the metal finish layer and the lead free solder connector, wherein the second intermetallic compound is substantially free of copper.

18. The apparatus of claim 1, wherein the first intermetallic compound further comprises nickel.

19. The apparatus of claim 17, wherein the second intermetallic compound further comprises nickel.

20. The apparatus of claim 1, wherein the lead free solder connection comprises tin, and the first intermetallic compound comprises nickel and tin.

* * * * *

UNITED STATES PATENT AND TRADEMARK OFFICE
CERTIFICATE OF CORRECTION

PATENT NO. : 8,232,643 B2
APPLICATION NO. : 12/729021
DATED : July 31, 2012
INVENTOR(S) : Yao-Chun Chuang Page 1 of 2

It is certified that error appears in the above-identified patent and that said Letters Patent is hereby corrected as shown below:

In Drawings,

Sheet 5 of 7, FIG. 5, replace with the attached page.

Signed and Sealed this
Second Day of August, 2016

Michelle K. Lee
*Director of the United States Patent and Trademark Office*

FIG. 5